(12) United States Patent
You et al.

(10) Patent No.: US 9,147,643 B2
(45) Date of Patent: Sep. 29, 2015

(54) SEMICONDUCTOR PACKAGE

(71) Applicants: SE-Ho You, Seoul (KR); Jinho Lee, Seoul (KR)

(72) Inventors: SE-Ho You, Seoul (KR); Jinho Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/260,415

(22) Filed: Apr. 24, 2014

(65) Prior Publication Data

US 2014/0319662 A1   Oct. 30, 2014

(30) Foreign Application Priority Data

Apr. 26, 2013 (KR) .................. 10-2013-0046795

(51) Int. Cl.
| | |
|---|---|
| H01L 23/04 | (2006.01) |
| H01L 23/48 | (2006.01) |
| H01L 23/498 | (2006.01) |
| H01L 23/538 | (2006.01) |
| H01L 25/065 | (2006.01) |
| H01L 23/31 | (2006.01) |

(52) U.S. Cl.
CPC ........ *H01L 23/481* (2013.01); *H01L 23/49816* (2013.01); *H01L 23/49827* (2013.01); *H01L 23/49838* (2013.01); *H01L 23/5386* (2013.01); *H01L 25/0657* (2013.01); *H01L 23/3128* (2013.01); *H01L 2224/0401* (2013.01); *H01L 2224/04042* (2013.01); *H01L 2224/0557* (2013.01); *H01L 2224/06181* (2013.01); *H01L 2224/16145* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2924/00014* (2013.01); *H01L 2924/15192* (2013.01); *H01L 2924/15311* (2013.01)

(58) Field of Classification Search
CPC ................... H01L 23/49838; H01L 25/0657
USPC ..................... 257/698, 700, 778, E23.145
See application file for complete search history.

(56) References Cited

U.S. PATENT DOCUMENTS

| | | |
|---|---|---|
| 5,079,069 A | 1/1992 | Howard et al. |
| 5,640,048 A * | 6/1997 | Selna ........................ 257/738 |

(Continued)

FOREIGN PATENT DOCUMENTS

| | | |
|---|---|---|
| JP | 2000-188448 A | 7/2000 |
| JP | 2001-23849 A | 1/2001 |

(Continued)

*Primary Examiner* — Nitin Parekh
(74) *Attorney, Agent, or Firm* — Sughrue Mion, PLLC

(57) ABSTRACT

Provided is a semiconductor package which may include a package substrate which includes a power supply region and an interconnection region around the power supply region, a plurality of ground terminals and a plurality of power terminals, which are disposed in the power supply region with a dielectric interposed between the ground terminals and the power terminals, wherein the ground terminals and the power terminals extend from a top surface of the package substrate to a bottom surface of the package substrate, and at least one semiconductor chip mounted on the package substrate, the semiconductor chip includes a plurality of ground pads which are commonly connected to a ground terminal of the ground terminals and a plurality of power pads which are commonly connected to a power terminal of the power terminals.

18 Claims, 18 Drawing Sheets

(56) References Cited

U.S. PATENT DOCUMENTS

| | | | | |
|---|---|---|---|---|
| 5,691,568 | A | * | 11/1997 | Chou et al. ............... 257/691 |
| 5,942,795 | A | * | 8/1999 | Hoang ...................... 257/692 |
| 6,384,476 | B2 | | 5/2002 | Takeuchi |
| 6,861,740 | B2 | * | 3/2005 | Hsu .......................... 257/691 |
| 6,891,260 | B1 | * | 5/2005 | Mora et al. ............... 257/691 |
| 7,408,120 | B2 | | 8/2008 | Kim et al. |
| 7,992,297 | B2 | | 8/2011 | Zhao et al. |
| 8,129,625 | B2 | | 3/2012 | Kato |
| 2005/0178585 | A1 | | 8/2005 | Kim et al. |
| 2006/0284304 | A1 | * | 12/2006 | Caletka et al. ........... 257/700 |
| 2007/0029106 | A1 | | 2/2007 | Kato |
| 2008/0042257 | A1 | * | 2/2008 | Hsu .......................... 257/700 |
| 2008/0054460 | A1 | * | 3/2008 | Hung ....................... 257/737 |
| 2008/0216298 | A1 | | 9/2008 | Dudnikov |
| 2009/0072398 | A1 | * | 3/2009 | Irsigler et al. ............ 257/741 |
| 2010/0132191 | A1 | | 6/2010 | Zhao et al. |
| 2010/0276189 | A1 | | 11/2010 | Song et al. |
| 2012/0018885 | A1 | * | 1/2012 | Lee et al. ................. 257/738 |

FOREIGN PATENT DOCUMENTS

| | | |
|---|---|---|
| JP | 2005-64028 A | 3/2005 |
| JP | 2009-111658 A | 5/2009 |
| JP | 2010-10413 A | 1/2010 |

* cited by examiner

SEMICONDUCTOR PACKAGE

CROSS-REFERENCE TO RELATED APPLICATIONS

This application claims priority from Korean Patent Application No. 10-2013-0046795, filed on Apr. 26, 2013, in the Korean Intellectual Property Office, the disclosure of which is hereby incorporated by reference in its entirety.

BACKGROUND

Example embodiments relate to a semiconductor package. In particular, exemplary embodiments relate, to a semiconductor package including a package substrate having an improved power-transmission property.

Advanced semiconductor fabrication technology makes it possible to continuously increase density and speed of semiconductor chips and reduce operation voltages of semiconductor chips. Accordingly, the number of pads on the semiconductor chip may be increased to several hundreds or thousands. However, to reduce power consumption, a power supplied to the semiconductor chip needs to be being reduced. Therefore, a noise margin becomes lower as the number of pads is increased. If the noise margin is lowered, overall performance of the system deteriorates.

The noise margin may strongly affect performance of a semiconductor system. For the system, a simultaneous switching noise (SSN) may originate from a package and a printed circuit board. The SSN can be reduced using many power/ground cells. However, since using many power/ground cells increases the chip size and package fabrication cost, this approach is not ideal.

SUMMARY

Example embodiments provide a semiconductor package including a package substrate having an improved power-transmission property.

Other example embodiments provide a package substrate having an improved power-transmission property.

According to an aspect of an exemplary embodiment, a semiconductor package may include a package substrate which includes a power supply region and an interconnection region around the power supply region, a plurality of ground and a plurality of power terminals, which are disposed in the power supply region with a dielectric interposed between the ground terminals and the power terminals, wherein the ground terminals and the power terminals extend from a top surface of the package substrate to a bottom surface of the package substrate, and at least one semiconductor chip mounted on the package substrate includes a plurality of ground pads which are commonly connected to a ground terminal of the ground terminals and a plurality of power pads which are commonly connected to a power terminal of the power terminals.

In example embodiments the power terminal has a closed-loop structure enclosing the ground terminal in plan view.

In example embodiments, the power terminal may include a first power terminal at one side of the ground terminal with the dielectric interposed between the first power terminal and the ground terminal, and a second power terminal at another side of the ground terminal with the dielectric interposed between the second power terminal and the ground terminal.

In example embodiments, the package substrate may include a plurality of insulating layers vertically stacked in the interconnection region and inner interconnection lines disposed between the insulating layers, and wherein the dielectric may be formed of a material having a dielectric constant higher than the insulating layers.

In example embodiments, the ground terminal and the power terminal may be electrically separated from the inner interconnection lines.

In example embodiments, the ground terminal may include a plurality of vertically-stacked first conductive patterns and a plurality of first via plugs which electrically connect the vertically-stacked first conductive patterns, wherein the power terminal may include a plurality of vertically-stacked second conductive patterns and a plurality of second via plugs which electrically connect the vertically-stacked second conductive patterns.

In example embodiments an area of the ground terminal may be larger than the power terminal in plan view.

In example embodiments, a number of the ground pads may be greater than a number of the power pads.

In example embodiments, a plurality of the semiconductor chips may be mounted on the package substrate, and wherein the ground terminal and the power terminal may be shared by the semiconductor chips.

In example embodiments, the package substrate may include a plurality of bonding pads which are disposed on a top surface of the interconnection region, wherein the bonding pads are connected to I/O pads, which may be used to input and output electrical signals to the at least one semiconductor chip. A width of the ground terminal may be greater than a width of the bonding pads.

According to another aspect of an exemplary embodiment, a package substrate may include a substrate including a top surface on which a semiconductor chip may be mounted, wherein the substrate further includes a power supply region and an interconnection region around the power supply region, a plurality of inner interconnection lines disposed in the interconnection region of the substrate to transmit external signals to the semiconductor chip, a ground terminal disposed in the power supply region of the substrate, and which extends from the top surface of the substrate to a bottom surface of the substrate, and a power terminal disposed in the power supply region of the substrate, wherein the power terminal is disposed at one side of the ground terminal with a dielectric interposed between the power terminal and the ground terminal such that the power terminal is electrically coupled with the ground terminal.

In example embodiments, the substrate may include a plurality of insulating layers, whose dielectric constant may be smaller than the dielectric.

In example embodiments, the power terminal has a closed-loop structure enclosing the ground terminal in plan view.

In example embodiments, the power terminal may include a first power terminal at one side of the ground terminal with the dielectric interposed between the first power terminal and the ground terminal, and a second power terminal at another side of the ground terminal with the dielectric interposed between the second power terminal and the ground terminal.

In example embodiments, the substrate may include a plurality of bonding pads which are disposed on the top surface of the interconnection region, and wherein the ground terminal and the power terminal have widths which may be greater than the bonding pads.

According to yet another aspect of an exemplary embodiment, a semiconductor package may include a package substrate which includes a power supply region and an interconnection region, a ground terminal disposed in the power supply region, a first power terminal disposed in the power supply region and at one side of the ground terminal with a dielectric disposed between the first power terminal and the ground terminal; a second power terminal disposed in the power supply region and at another side of the ground terminal with the dielectric disposed between the second power terminal and the ground terminal; and a first semiconductor chip and a second semiconductor chip, which are mounted on the package substrate, wherein the interconnection region surrounds the power supply region, wherein the first semiconductor chip is connected to the first power terminal and the ground terminal, and wherein the second semiconductor chip is connected to the second power terminal and the ground terminal.

BRIEF DESCRIPTION OF THE DRAWINGS

Example embodiments will be more clearly understood from the following brief description taken in conjunction with the accompanying drawings. The accompanying drawings represent non-limiting, example embodiments as described herein. In the drawings.

DETAILED DESCRIPTION OF EXEMPLARY EMBODIMENTS

Figure 1:
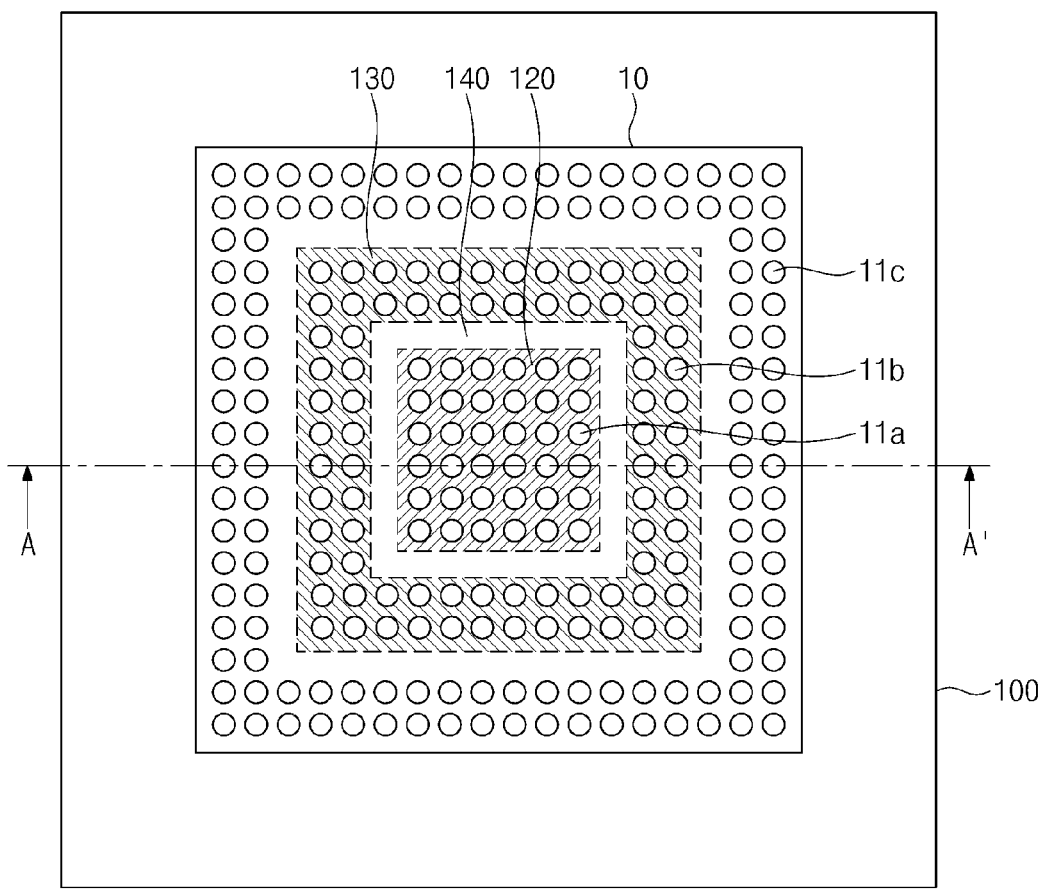
FIG. 1 is a schematic plan view of a semiconductor package according to a first embodiment.

It should be noted that the drawings are intended to illustrate the general characteristics of methods, structure and/or materials utilized in certain example embodiments and to supplement the written description. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Example embodiments will now be described more fully with reference to the accompanying drawings, in which example embodiments are shown. Example embodiments may, however, be embodied in many different forms and should not be construed as being limited to the embodiments set forth herein. These embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper", etc., may be used herein for ease of description to describe one element or a feature relationship to another element or feature as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
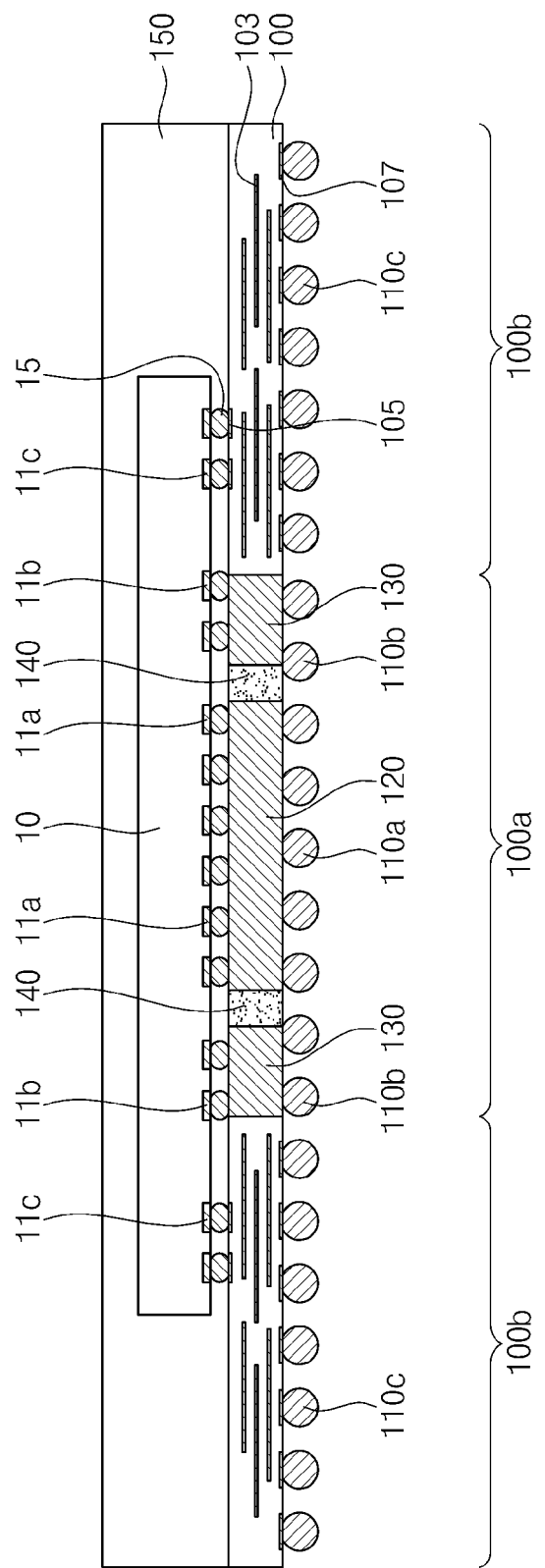
FIG. 2 is a sectional view taken along a line of A-A' of FIG. 1 to illustrate the semiconductor package according to the first embodiment.

FIG. 1 is a schematic plan view of a semiconductor package according to a first embodiment. FIG. 2 is a sectional view taken along a line of A-A' of FIG. 1 to illustrate the semiconductor package according to the first embodiment.

Referring to FIGS. 1 and 2, a semiconductor package may include a semiconductor chip 10 mounted on a package substrate 100.

According to some embodiments, the package substrate 100 may include a power supply region 100a and an interconnection region 100b around the power supply region 100a. The package substrate 100 has a top surface and a bottom surface, and inner interconnection lines 103, bonding pads 105, external connection pads 107, a ground terminal 120, and a power terminal 130. The power terminal 130 may be provided in or on the package substrate 100.

The ground terminal 120 may be configured to supply a ground voltage supplied from the outside to the semiconductor chip 10, and may be disposed in a central region of the power supply region 100a. The power terminal 130 may be configured to supply a power voltage supplied from the outside to the semiconductor chip 10, and may be disposed in the power supply region 100a or around the ground terminal 120. A dielectric 140 may be interposed between the ground terminal 120 and the power terminal 130. The dielectric 140 may be in direct contact with the ground terminal 120 and the power terminal 130. Further, according to some embodiments, the ground terminal 120 may be coupled to a plurality of ground pads 11a provided on the semiconductor chip 10 via bumps 15. The power terminal 130 may be coupled to a plurality of power pads 11b provided on the semiconductor chip 10 via the bumps 15. The ground and power voltages may be electrically coupled to each other, when they are supplied to the semiconductor chip 10 via the ground terminal 120 and the power terminal 130.

The ground terminal 120 and the power terminal 130 may extend from a top surface of the package substrate 100 to a bottom surface. In other words, the ground terminal 120 and the power terminal 130 may be provided to penetrate the package substrate 100. The power terminal 130 may be spaced apart from the ground terminal 120 by the dielectric 140 interposed therebetween. In example embodiments, in plan view, the power terminal 130 may be provided to have a closed-loop structure enclosing the ground terminal 120.

Also, in plan view, the ground terminal 120 may have an area different from that of the power terminal 130. For example, the area of the ground terminal 120 may be greater than that of the power terminal 130.

According to some embodiments, a coupling capacitance between the ground terminal 120 and the power terminal 130 may increase as an overlapping area between the ground terminal 120 and the power terminal 130 increases. In other words, an electric power can be supplied to the semiconductor chip 10 with a reduced noise margin. Thus, it is possible to improve delivery efficiency of the power supplied to the semiconductor chip 10. As a result, it is possible to improve performance of the semiconductor package.

Furthermore, first external connection terminals 110a, to which the ground voltage is applied, may be attached to a bottom surface of the ground terminal 120. Second external connection terminals 110b, to which the power voltage is applied, may be attached to a bottom surface of the power terminal 130.

According to some embodiments, the bonding pads 105 and the inner interconnection lines 103 may be disposed in the interconnection region 100b of the package substrate 100. The bonding pads 105 may be arranged on the top surface of the package substrate 100, and the external connection pads 107 may be arranged on the bottom surface of the package substrate 100. The bonding pads 105 may be electrically connected to the external connection pads 107 through the inner interconnection lines 103. The bonding pads 105 may allow I/O signals to be transmitted between the outside and the semiconductor chip 10. In the interconnection region 100b of the package substrate 100, external connection terminals 110c, such as solder balls or solder burns, may be attached to the external connection pads 107.

The semiconductor chip 10 mounted on the package substrate 100 may include I/O pads 11c for transmitting data and/or control signals, the ground pads 11a for transmitting the ground voltage, and the power pads 11b for transmitting the power voltage. The ground pads 11a, the power pads 11b, and the I/O pads 11c may be provided on the bottom surface of the semiconductor chip 10.

In example embodiments, the semiconductor chip 10 may be one of logic devices, such as photo-electronic devices, communication devices, digital signal processors, controllers, or system-on-chips. Alternatively, the semiconductor chip 10 may be one of memory devices, such as DRAM, NAND flash, NOR flash, OneNAND, PRAM, ReRAM or MRAM.

In plan view, the semiconductor chip 10 may include a ground pad region, in which the ground pads 11a are disposed, a power pad region, in which the power pads 11b are disposed, and an I/O pad region, in which the I/O pads 11c are disposed. The power pad region may be disposed between the I/O pad region and the ground pad region. In example embodiments, the ground pad region and the power pad region may occupy about 70-80% of a total area of the semiconductor chip 10. The area of the ground pad region may be greater than that of the power pad region. For example, the number of the ground pads 11a provided in the ground pad region may be greater than that of the power pads 11b provided in the power pad region.

The ground pads 11a of the semiconductor chip 10 may be connected in common to one ground terminal 120 provided on the package substrate 100. The power pads 11b of the semiconductor chip 10 may be connected in common to one power terminal 130 provided on the package substrate 100.

The semiconductor chip 10 mounted on the package substrate 100 may be encapsulated with a molding layer 150. The molding layer 150 may be disposed between the package substrate 100 and the semiconductor chip 10. Therefore, the molding layer 150 may serve as an underfill layer. The molding layer 150 may include an epoxy molding compound.

Figure 3:
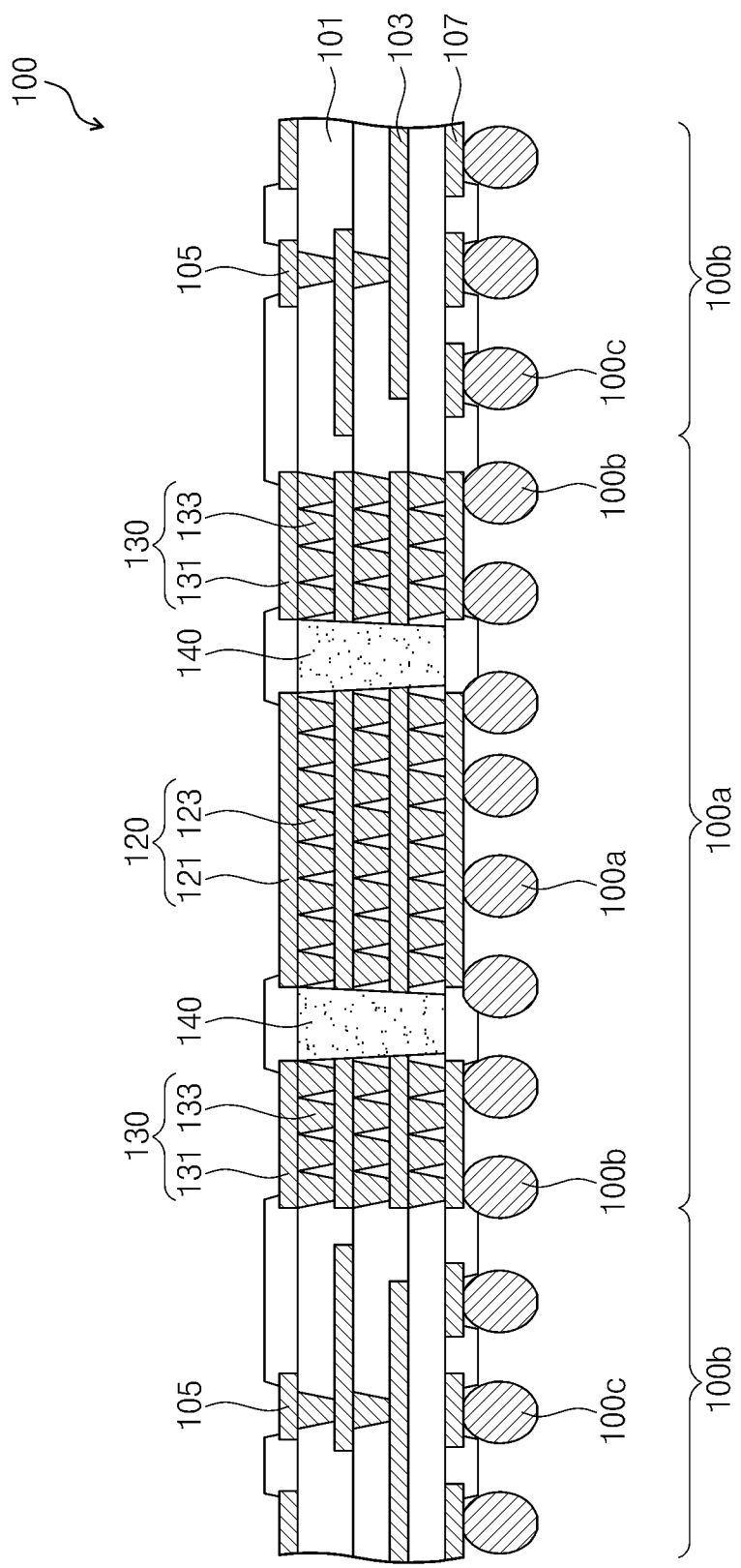
FIG. 3 is a sectional view illustrating a portion of a package substrate in the semiconductor package according to the first embodiment.

FIG. 3 is a sectional view illustrating a portion of a package substrate in the semiconductor package according to the first embodiment.

Referring to FIG. 3, the package substrate 100 may include a plurality of insulating layers 101 vertically stacked one on another. The inner interconnection lines 103 may be provided between the insulating layers 101 in the interconnection region 100b.

The insulating layers 101 may include at least one of thermosetting resins, polymer materials, epoxy resins (e.g., flame retardant 4 (FR-4), bismaleimide triazine (BT), ajinomoto build up film (ABF)) or prepreg (PPG).

The inner interconnection lines 103 may be formed by a plating process using a photoresist pattern as a mask. The plating process may be performed using electroless-plating and electroplating techniques. The internal line 103 may be formed of a metal material, such as copper, copper alloys, silver, palladium, platinum, silver-palladium alloys, or nickel.

In example embodiments, the ground terminal 120 and the power terminal 130 formed on the package substrate 100 may include conductive patterns, which may be formed together with the inner interconnection lines 103, and via plugs connecting vertically adjacent ones of the conductive patterns to each other. For example, the ground terminal 120 may include first conductive patterns 121 formed on the insulating layers 101 of the power supply region 100a and first via plugs 123 penetrating the insulating layers 101 to connect vertically adjacent ones of the first conductive patterns 121. The power terminal 130 may include second conductive patterns 131 disposed around the first conductive patterns 121 and second via plugs 133 penetrating the insulating layers 101 to connect vertically adjacent ones of the second conductive patterns 131.

The first and second conductive patterns 121 and 131 may be electrically separated from the inner interconnection lines 103. In example embodiments, the second conductive patterns 131 may be formed around the first conductive patterns 121, and the first conductive patterns 121 and the second conductive patterns 131 may be electrically separated from each other by the dielectric 140 interposed therebetween. The dielectric 140 may be formed of a material having a dielectric constant higher than the insulating layers 101. For example, the insulating layers 101 may have a dielectric constant of about 2.0-4.0, and the dielectric 140 may have a dielectric constant of about 5.0-7.0. In example embodiments, the insulating layers 101 may be formed of epoxy resins or thermosetting resins, and the dielectric 140 may be formed of silicon oxide or silicon nitride.

Figure 4:
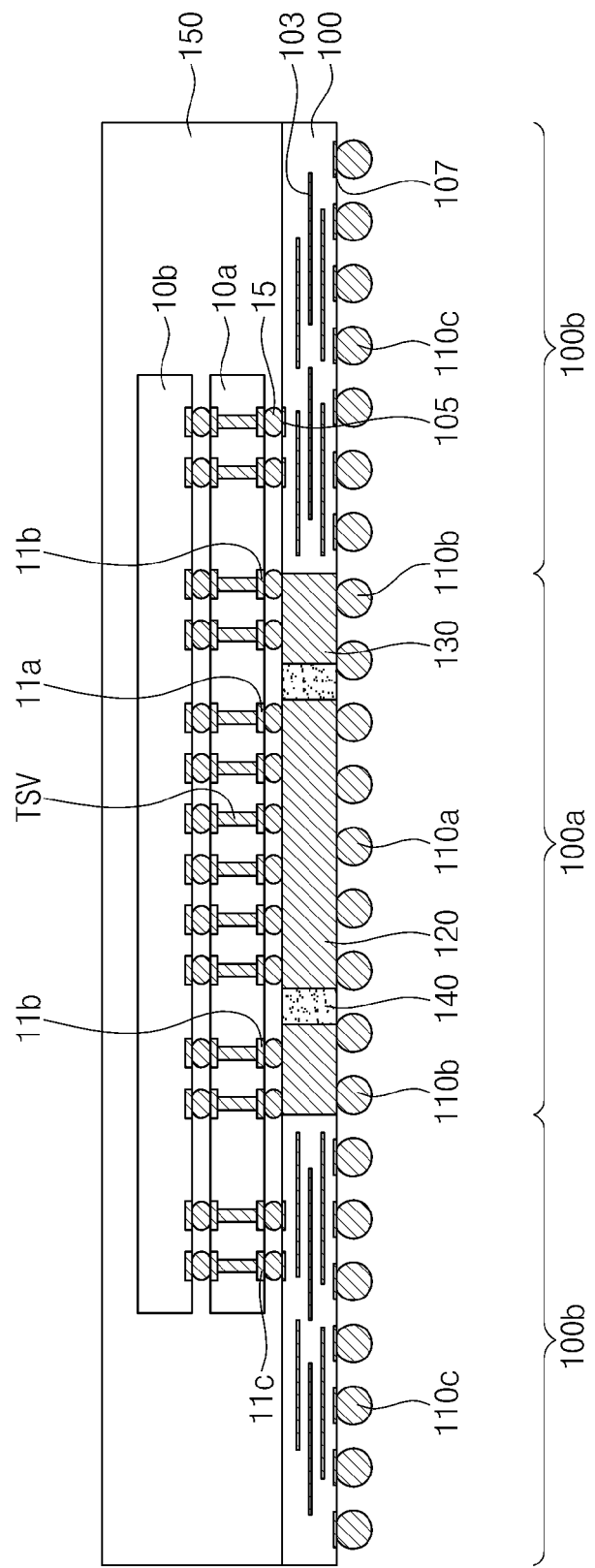
FIG. 4 is a sectional view illustrating a modification of the semiconductor package according to the first embodiment.

FIG. 4 is a sectional view illustrating a modification of the semiconductor package according to the first embodiment.

As shown in FIG. 4, the semiconductor package may include first and second semiconductor chips 10a and 10b which are stacked on the package substrate 100. The first semiconductor chip 10a may be mounted on the first package substrate 100 in a flip-chip bonding manner, and the second semiconductor chip 10b may be mounted on the first semiconductor chip 10a.

In example embodiments, the first and second semiconductor chips 10a and 10b may be configured to have the same operation property or perform the same function. For example, both of the first and second semiconductor chips 10a and 10b may be one of logic devices, such as photo-electronic devices, communication devices, digital signal processors, controllers, or system-on-chips. Alternatively, both of the first and second semiconductor chips 10a and 10b may be one of memory devices, such as DRAM, NAND flash, NOR flash, OneNAND, PRAM, ReRAM or MRAM. In other embodiments, the first and second semiconductor chips 10a and 10b may be configured to have different operation properties or perform different functions. For example, the first semiconductor chip 10a may be one of the logic devices, such as photo-electronic devices, communication devices, digital signal processors, controllers, or system-on-chips, while the second semiconductor chip 10b may be one of the memory chips, such as DRAM, NAND flash, NOR flash, OneNAND, PRAM, ReRAM, or MRAM.

As described with reference to FIGS. 1 and 2, the package substrate 100 may include the power supply region 100a and the interconnection region 100b around the power supply region 100a, and the ground terminal 120 and the power terminal 130 may be disposed with the dielectric 140 interposed therebetween in the power supply region 100a. The ground terminal 120 and the power terminal 130 may extend from the top surface of the package substrate 100 to the bottom surface. The bumps 15 may be attached on the top surfaces of the ground terminal 120 and the power terminal 130. The first external connection terminals 110a may be attached on the bottom surface of the ground terminal 120, and the second external connection terminals 110b may be attached on the bottom surface of the power terminal 130. Ground and power voltages from the external electronic device may be applied to the first and second external connection terminals 110a and 110b, respectively. Further, the external connection terminals 110c may be attached on the external connection pads 107 to allow electrical signals to be transmitted from/to the external electronic device.

In example embodiments, the first semiconductor chip 10a may include the ground pads 11a, the power pads 11b, and the I/O pads 11c provided on the bottom surface thereof. The ground pads 11a of the first semiconductor chip 10a may be arranged on the top surface of the ground terminal 120 of the package substrate 100, and the power pads 11b of the first semiconductor chip 10a may be arranged on the top surface of the power terminal 130 of the package substrate 100. For example, the ground terminal 120 of the package substrate 100 may be electrically connected to a plurality of the ground pads 11a of the first semiconductor chip 10a via the bumps 15. And the power terminal 130 of the package substrate 100 may be electrically connected to a plurality of the power pads 11b of the first semiconductor chip 10a through the bumps 15.

In addition, the second semiconductor chip 10b may be electrically connected to the first semiconductor chip 10a and the ground terminal 120 and the power terminal 130 of the package substrate 100 via through-silicon vias (TSV).

Figure 5:
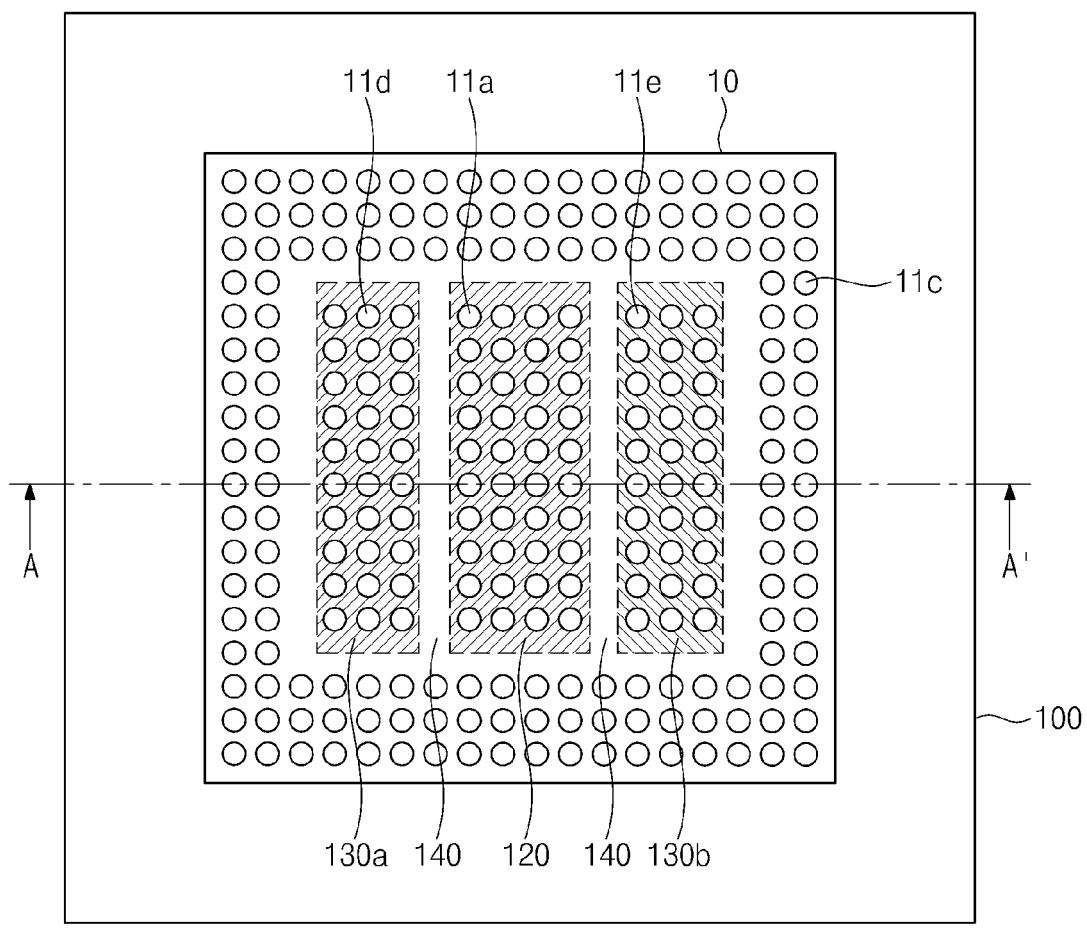
FIG. 5 is a schematic plan view of a semiconductor package according to a second embodiment.
Figure 6:
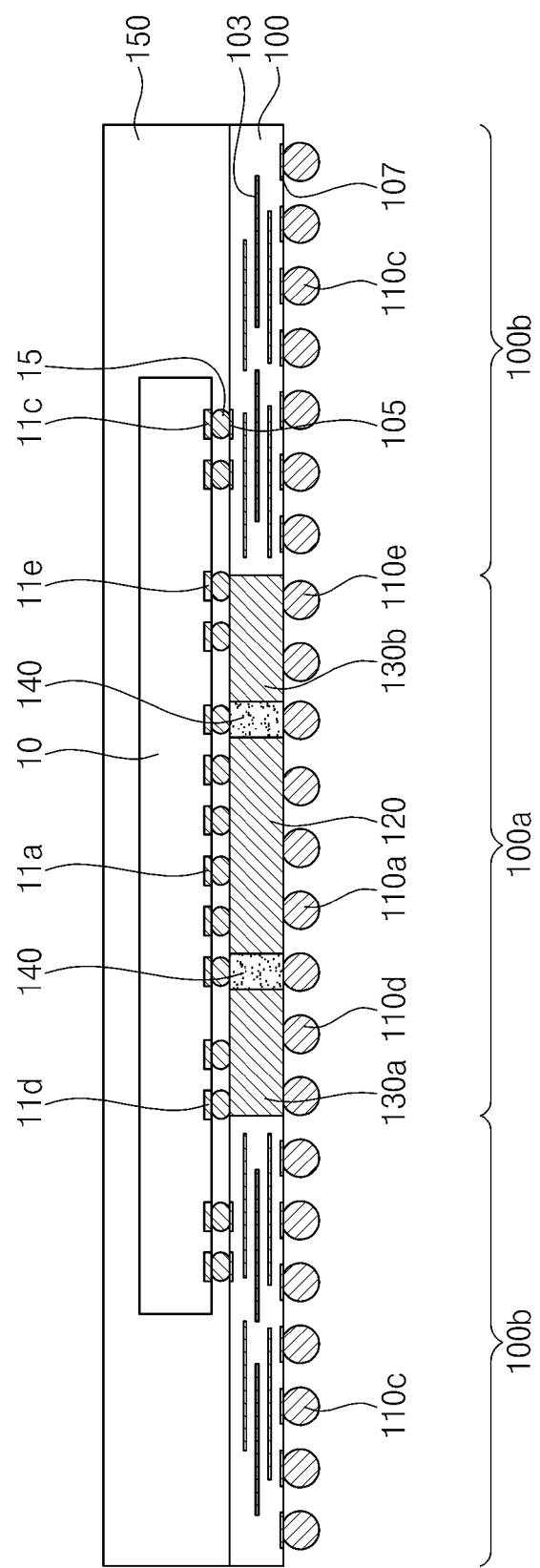
FIG. 6 is a sectional view taken along a line of A-A' of FIG. 5 to illustrate the semiconductor package according to the second embodiment.

FIG. 5 is a schematic plan view of a semiconductor package according to a second embodiment. FIG. 6 is a sectional view taken along a line of A-A' of FIG. 5 to illustrate the semiconductor package according to the second embodiment.

Referring to FIGS. 5 and 6, as described above, a semiconductor package may include the semiconductor chip 10 mounted on the package substrate 100 and encapsulated with the molding layer 150.

The package substrate 100 may include the power supply region 100a and the interconnection region 100b around the power supply region 100a, as described with reference to FIGS. 1 through 3. According to the present embodiment, at least two different power voltages may be applied to the semiconductor chip 10. For example, a first power voltage of about 1.5 V and a second power voltage of about 3.0 V may be provided to the semiconductor chip 10. In example embodiments, the ground terminal 120, a first power terminal 130a, and a second power terminal 130b may be provided on the power supply region 100a of the package substrate 100.

The first power terminal 130a may be disposed at one side of the ground terminal 120, and the second power terminal 130b may be disposed at the other side of the ground terminal 120. Further, the dielectric 140 may be interposed between the first power terminal 130a and the ground terminal 120 and between the second power terminal 130b and the ground terminal 120. As described with reference to FIG. 3, the dielectric 140 may be formed of a material, whose dielectric constant is higher than that of the insulating layers 101 (e.g., FIG. 4) constituting the package substrate 100.

In example embodiments, as described above, the ground terminal 120 and the first and second power terminals 130a and 130b may extend from the top surface of the package substrate 100 to the bottom surface. The ground terminal 120 may have a width greater than the first and second power terminals 130a and 130b.

In example embodiments, the semiconductor chip 10 may include the ground pads 11a, first power pads 11d, and second power pads 11e provided on the bottom surface thereof. In the case where the semiconductor chip 10 is mounted on the package substrate 100, a plurality of the first power pads 11d may be connected in common to the first power terminal 130a, and the second power pads 11e may be connected in common to the second power terminal 130e. First power connection terminals 110d may be attached on the bottom surface of the first power terminal 130a, and second power connection terminals 110e may be attached on the bottom surface of the second power terminal 130b. First and second power voltages from the external electronic device may be applied to the first and second power connection terminals 110d and 110e, respectively. Further, the ground connection terminals 110a may be attached on the bottom surface of the ground terminal 120.

Figure 7:
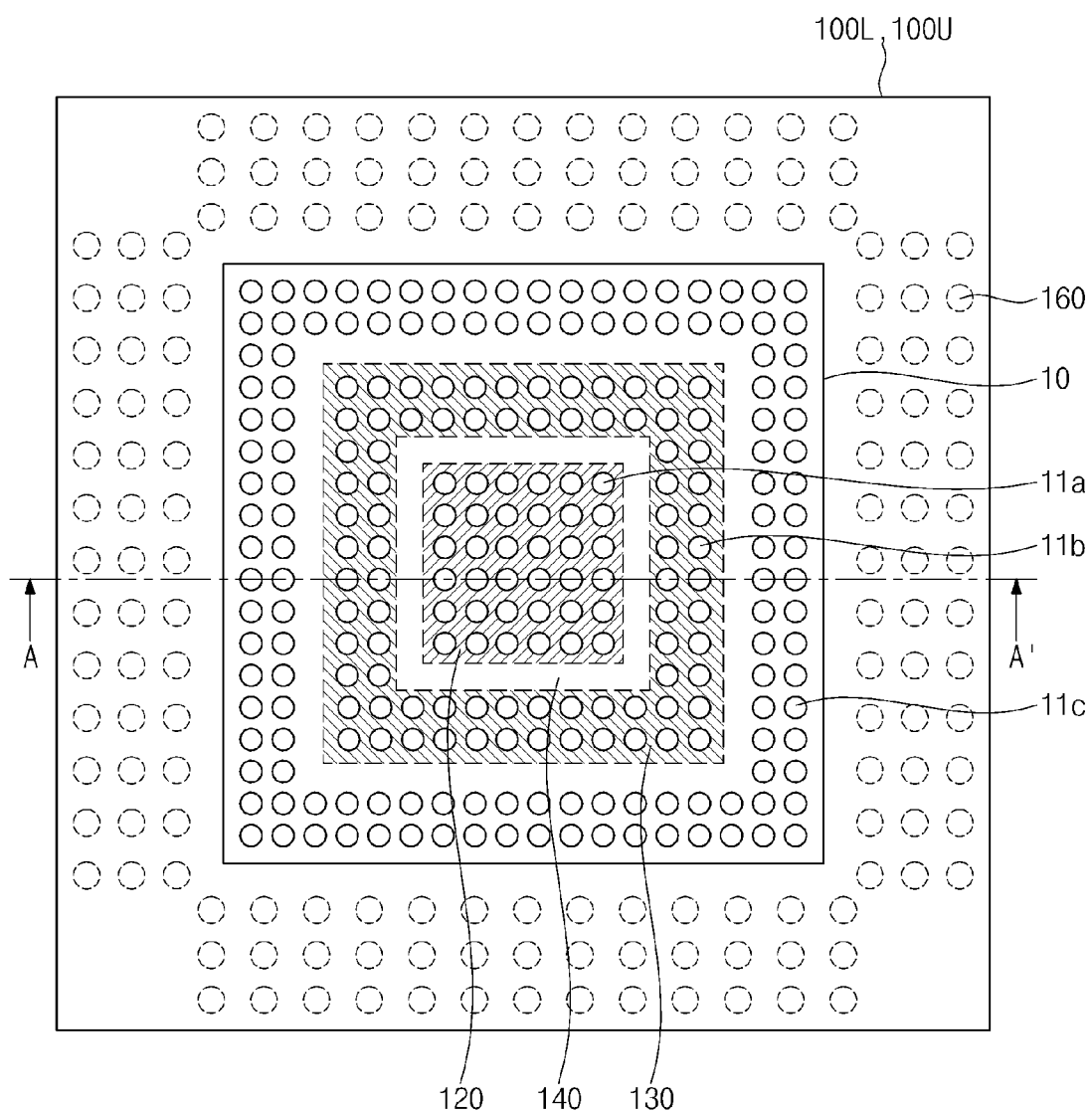
FIG. 7 is a schematic plan view of a semiconductor package according to a third embodiment.
Figure 8:
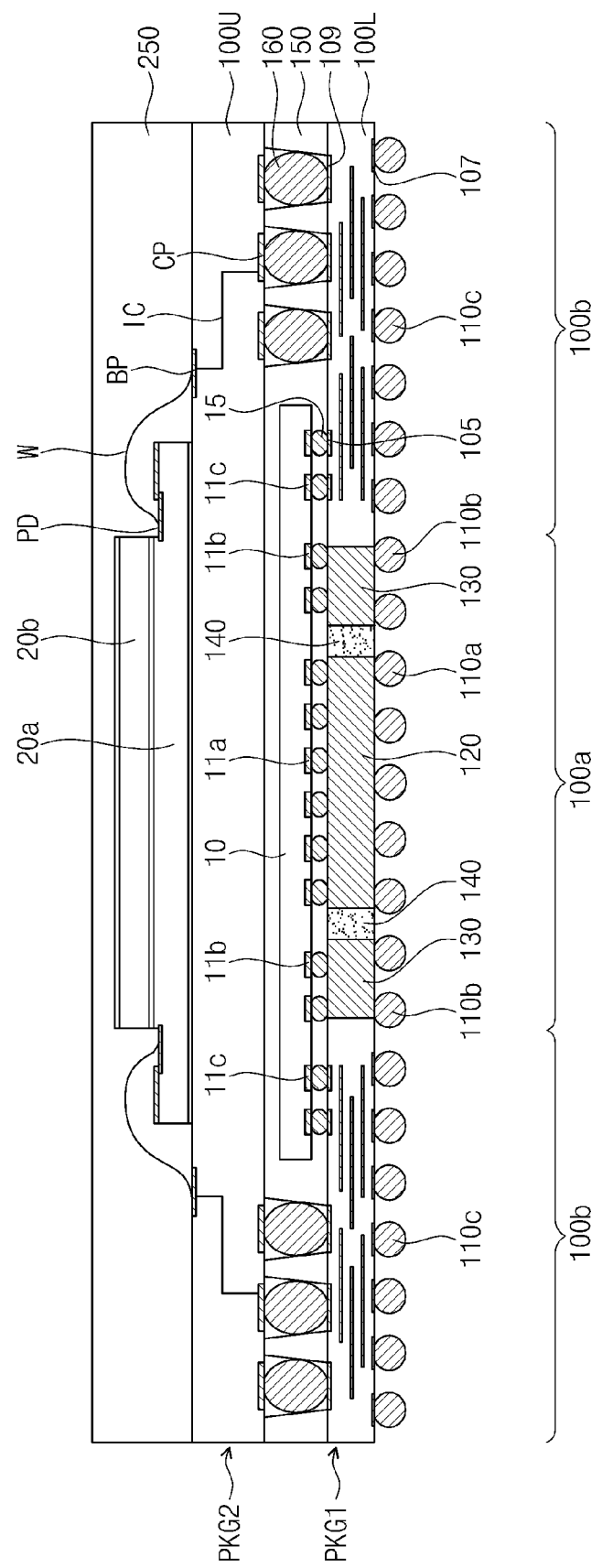
FIG. 8 is a sectional view taken along a line of A-A' of FIG. 7 to illustrate the semiconductor package according to the third embodiment.

FIG. 7 is a schematic plan view of a semiconductor package according to a third embodiment. FIG. 8 is a sectional view taken along a line of A-A' of FIG. 7 to illustrate the semiconductor package according to the third embodiment.

Referring to FIGS. 7 and 8, the semiconductor package may include first and second semiconductor packages PKG1 and PKG2 stacked sequentially.

The first semiconductor package PKG1 may include a logic chip 10 mounted on a first package substrate 100L, and the second semiconductor package PKG2 may include memory chips 20a and 20b mounted on the second package substrate 100U. In example embodiments, the logic chip 10 may be one of semiconductor chips, such as photo-electronic devices, communication devices, digital signal processors, controllers, or system-on-chips, and the memory chips 20a and 20b may be semiconductor chips, such as DRAM, NAND flash, NOR flash, OneNAND, PRAM, ReRAM or MRAM.

The first package substrate 100L may include the power supply region 100a and the interconnection region 100b around the power supply region 100a, as described with reference to FIGS. 1 through 3. The ground terminal 120 and the power terminal 130 may be provided on the power supply region 100a of the first package substrate 100L, and the bumps 15 may be attached on top surfaces of the ground terminal 120 and the power terminal 130.

The ground voltage may be applied to the plurality of ground pads 11a provided on the logic chip 10 via the ground terminal 120 uniquely provided in the first package substrate 100L. The power voltage may be applied to the power pads 11b provided on the logic chip 10 via the power terminal 130 uniquely provided in the first package substrate 100L.

The logic chip 10 mounted on the first package substrate 100L may be encapsulated by the first molding layer 150. In the present embodiment, the first molding layer 150 may cover the whole of the first package substrate 100L mounted with the logic chip 10 and have holes locally exposing connection pads 109, respectively. The connection pads 109 may be disposed around the logic chip 10.

The second package substrate 100U may have a top surface and a bottom surface and include bonding pads BP, inner interconnection lines IC, and connection pads CP. The first and second memory chips 20a and 20b may be stacked on the top surface of the second package substrate 100U, and a second molding layer 250 may be provided to encapsulate the resulting structure with the first and second memory chips 20a and 20b. For example, the first and second memory chips 20a and 20b may be configured to have the same operation property or perform the same function and the chip pads PD thereof may be provided to have the same arrangement. In certain embodiments, the second memory chip 20b may be rotated clockwise or counterclockwise by 90 degrees, on the first memory chip 20b.

The bonding pads BP may be arranged on the top surface of the second package substrate 100U and be electrically connected to the chip pads PD of the first and second semiconductor chips 20a and 20b via wires W. The connection pads CP may be arranged on the bottom surface of the second package substrate 100U and be electrically connected to the bonding pads BP via the inner interconnection lines IC. For example, the second package substrate 100U may be configured to include a flexible PCB, a rigid PCB, or any combination thereof, in which the inner interconnection lines IC are formed.

Connection terminals 160 may be provided in the holes of the first molding layer 150 to connect the first and second semiconductor packages PKG1 and PKG2 electrically with each other. The connection terminals 160 may connect electrically the connection pads 109 formed on the top surface of the first package substrate 100L to the connection pads CP formed on the bottom surface of the second package substrate 100U.

According to the present embodiment, the first and second memory chips 20a and 20b may additionally include power memory chips 20a and 20b. For example, the ground and power voltages may be provided to the first and second memory chips 20a and 20b via the connection pads 109.

Figure 9:
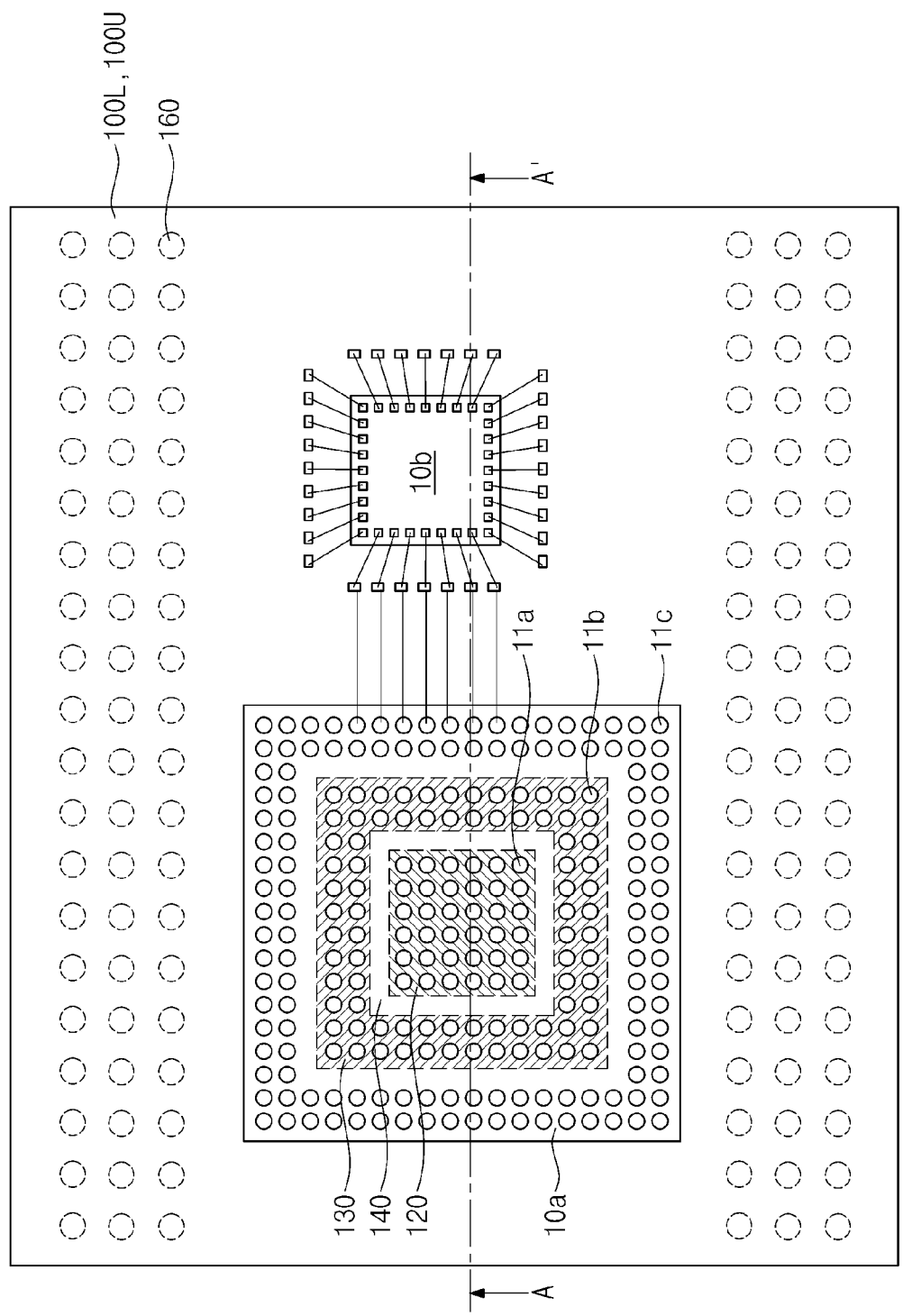
FIG. 9 is a schematic plan view of a semiconductor package according to a fourth embodiment.
Figure 10:
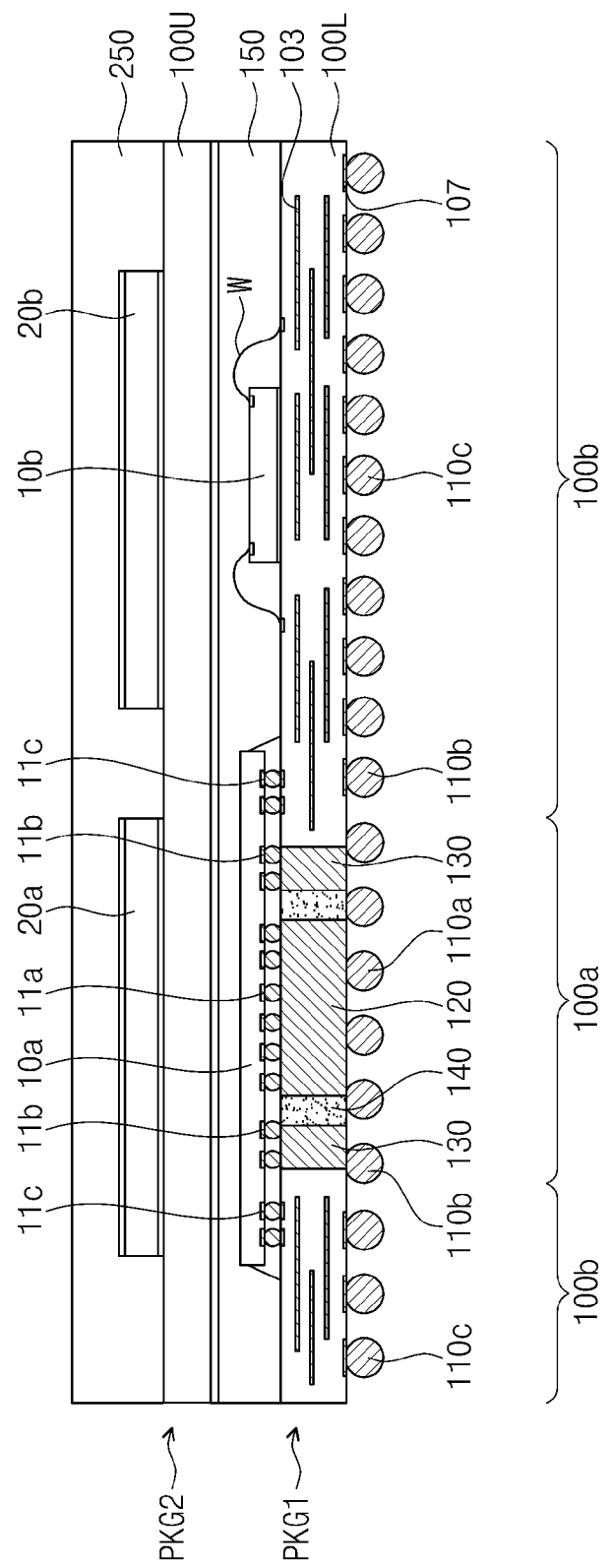
FIG. 10 is a sectional view taken along a line of A-A' of FIG. 9 to illustrate the semiconductor package according to the fourth embodiment.

FIG. 9 is a schematic plan view of a semiconductor package according to a fourth embodiment. FIG. 10 is a sectional view taken along a line of A-A' of FIG. 9 to illustrate the semiconductor package according to the fourth embodiment.

Referring to FIGS. 9 and 10, the semiconductor package may include first and second semiconductor packages PKG1 and PKG2 which are sequentially stacked. According to the present embodiment, the first semiconductor package PKG1 may include first and second logic chips 10a and 10b mounted on the first package substrate 100L.

The first logic chip 10a may be mounted on the first package substrate 100L in a flip-chip bonding manner, and the second logic chip 10b may be mounted on the first package substrate 100L in a wire bonding manner. The first logic chip 10a and the second logic chip 10b may be connected to each other by the internal line 103.

In example embodiments, the first logic chip 10a may be a digital baseband modem chip, and the second logic chip 10b may be an analog baseband modem chip. The second logic chip 10b may receive analog signals from the outside and send it to the first logic chip 10a. The first logic chip 10a may convert the analog signals transmitted from the second logic chip 10b into digital signals, and send data signals and command/address signals to the first and second memory chips 20a and 20b of the second semiconductor package PKG2.

As described with reference to FIGS. 1 through 3, the first package substrate 100L may include the power supply region 100a and the interconnection region 100b around the power supply region 100a. The ground terminal 120 and the power terminal 130 may be provided on the power supply region 100a of the first package substrate 100L, and the bumps 15 may be attached on the top surfaces of the ground terminal 120 and the power terminal 130.

According to the present embodiment, the first logic chip 10a may include a plurality of the ground pads 11a, a plurality of the power pads 11b, and a plurality of the I/O pads 11c. The ground pads 11a of the first logic chip 10a may be connected in common to the ground terminal 120 via the bumps 15, and the power pads 11b of the first logic chip 10a may be connected in common to the power terminal 130 via the bumps 15. Further, the I/O pads 11c of the first logic chip 10a may be electrically connected to the first and second memory chips 20a and 20b of the second semiconductor package via the inner interconnection lines 103 and the connection terminal 160, as described with reference to FIGS. 7 and 8. Furthermore, the external connection terminals 110a, 110b, and 110c may be attached on the external connection pads 107 provided on the bottom surface of the first package substrate 100L.

The second semiconductor package PKG2 may include the first and second memory chips 20a and 20b mounted on the second package substrate 100U. The second package substrate 100U may include the bonding pads BP, the connection pads CP, and the inner interconnection lines IC, as described with reference to FIG. 8. The bonding pads may be arranged on the top surface of the second package substrate 100U, and the connection pads may be arranged on the bottom surface of the second package substrate 100U.

According to the present embodiment, the first and second memory chips 20a and 20b may be disposed side-by-side on the top surface of the second package substrate 100U. The first and second memory chips 20a and 20b may be mounted on the second package substrate 100U in a wire bonding manner, and wires may be bonded to the bonding pads. The bonding pads may be electrically connected to the connection pads via the inner interconnection lines.

The connection terminals 160 may be attached between the first package substrate 100L and the second package substrate 100U. The first semiconductor package PKG1 may be electrically connected to the second semiconductor package PKG2 by the connection terminals 160. The connection terminals 160 may be configured to connect the connection pads 109 of the first package substrate 100L to the connection pads CP of the second package substrate 100U.

Figure 11:
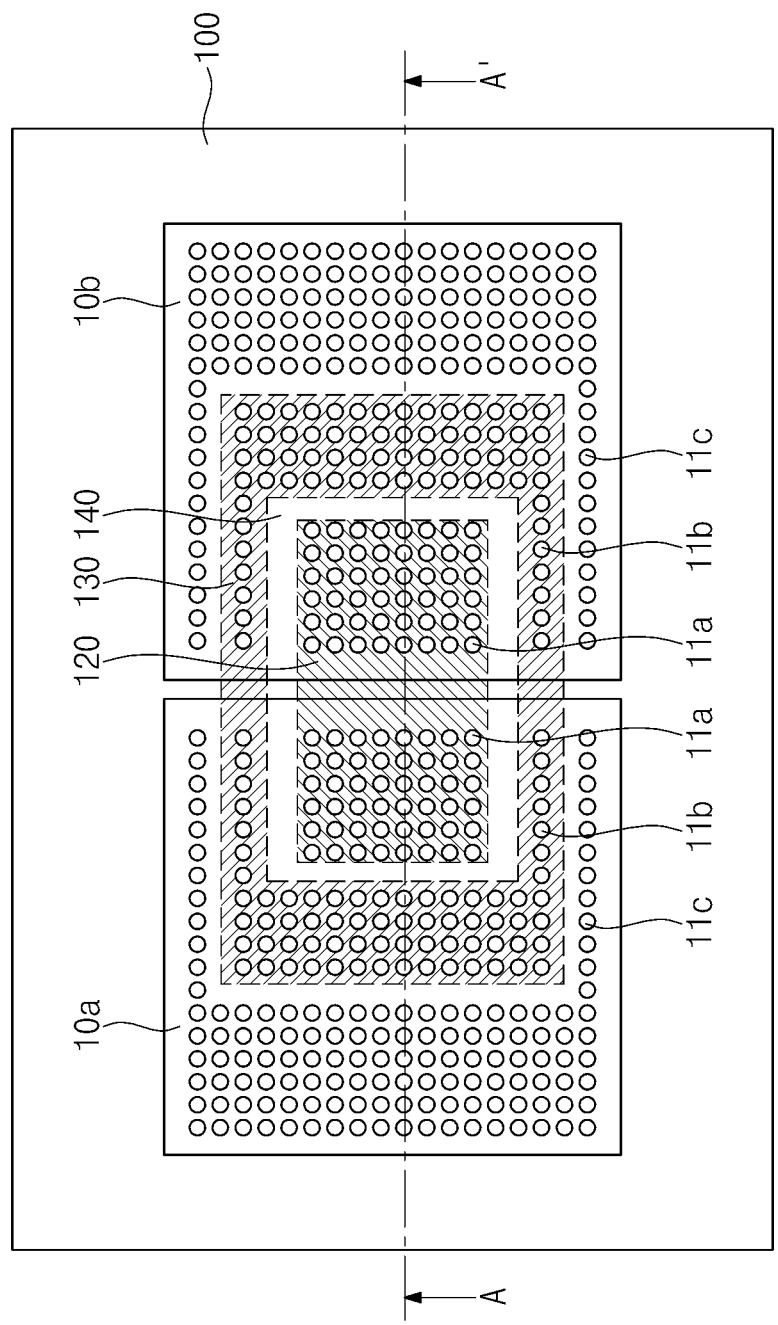
FIG. 11 is a schematic plan view of a semiconductor package according to a fifth embodiment.
Figure 12:
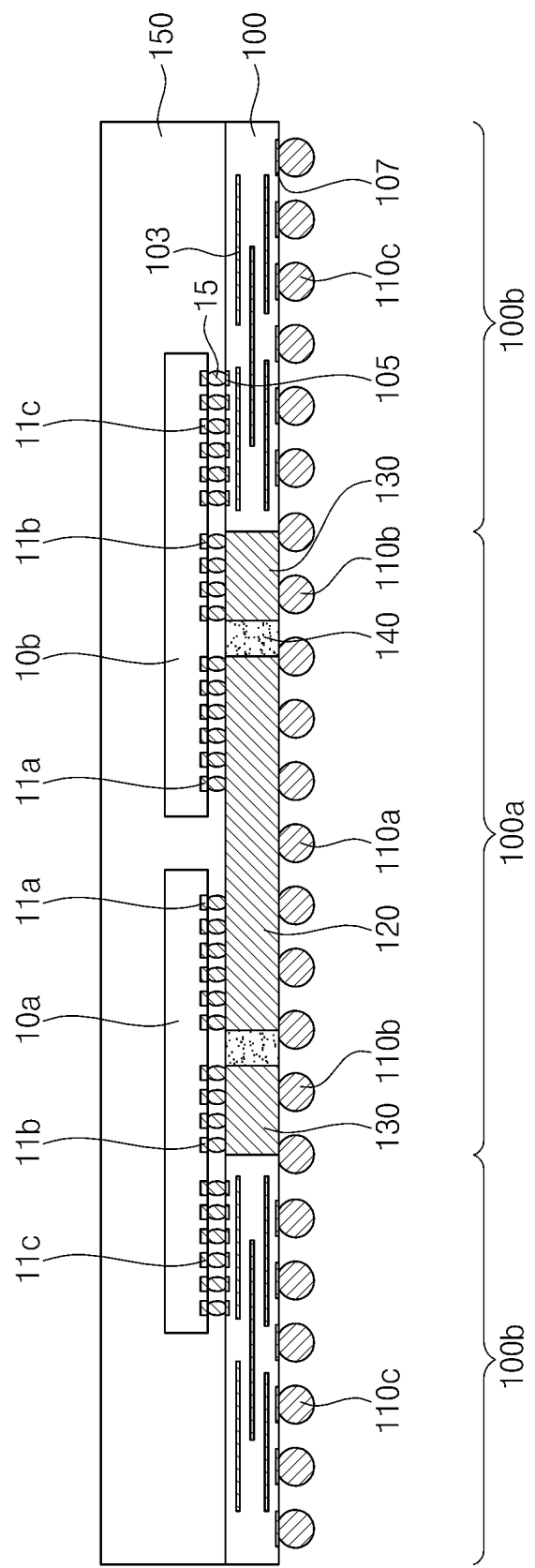
FIG. 12 is a sectional view taken along a line of A-A' of FIG. 11 to illustrate the semiconductor package according to the fifth embodiment.

FIG. 11 is a schematic plan view of a semiconductor package according to a fifth embodiment. FIG. 12 is a sectional view taken along a line of A-A' of FIG. 11 to illustrate the semiconductor package according to the fifth embodiment.

Referring to FIGS. 11 and 12, a semiconductor package may include the first and second semiconductor chips 10a and 10b which are mounted side-by-side on the package substrate 100.

The package substrate 100 may include the power supply region 100a and the interconnection region 100b around the power supply region 100a, as described with reference to FIGS. 1 through 3. The ground terminal 120 and the power terminal 130 may be provided on the power supply region 100a of the package substrate 100. As described above, the inner interconnection lines 103, the bonding pads 105, and the external connection pads 107 may be provided on the interconnection region 100b of the package substrate 100.

According to the present embodiment, the first and second semiconductor chips 10a and 10b may be configured to share the ground terminal 120 and the power terminal 130. For example, the ground terminal 120 and the power terminal 130 may extend from the top surface of the package substrate 100 to the bottom surface. The power terminal 130 may be disposed around the ground terminal 120 and have a closed-loop shape enclosing the ground terminal 120. The dielectric 140 may be interposed between the ground terminal 120 and the power terminal 130. As described above, the dielectric 140 may be formed of a material whose dielectric constant is higher than that of the insulating layers constituting the package substrate 100.

According to the present embodiment, the ground pads 11a of the first and second semiconductor chips 10a and 10b may be disposed on edge portions of the first and second semiconductor chips 10a and 10b, and the power pads 11b may be disposed on central portions of the first and second semiconductor chips 10a and 10b. The I/O pads 11c of the first and second semiconductor chips 10a and 10b may be disposed around the ground and power pads 11a and 11b. Further, the first and second semiconductor chips 10a and 10b may be provided to have minor symmetry on the package substrate 100. Accordingly, the ground pads 11a of the first and second semiconductor chips 10a and 10b may be connected in common to the ground terminal 120 using the bumps 15. The power pads 11b of the first and second semiconductor chips 10a and 10b may be connected in common to the power terminal 130 using the bumps 15.

Figure 13:
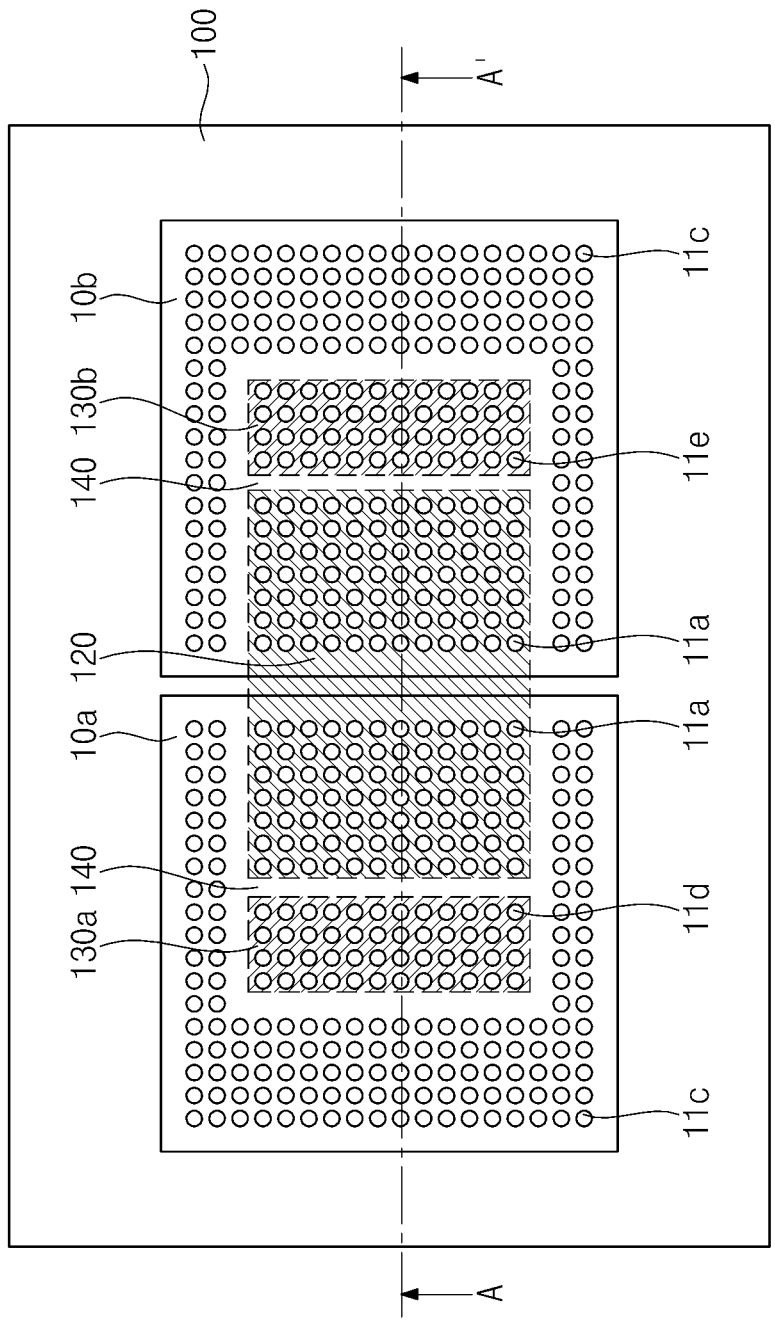
FIG. 13 is a schematic plan view of a semiconductor package according to a sixth embodiment.
Figure 14:
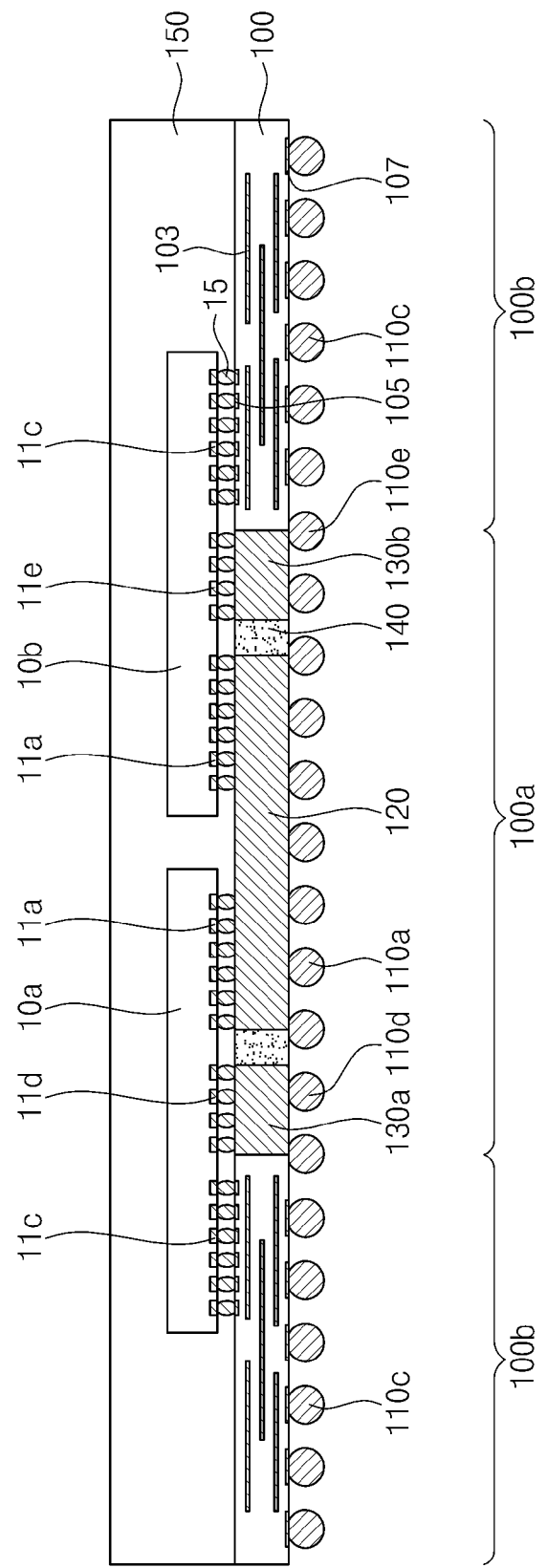
FIG. 14 is a sectional view taken along a line of A-A' of FIG. 13 to illustrate the semiconductor package according to the sixth embodiment.

FIG. 13 is a schematic plan view of a semiconductor package according to a sixth embodiment. FIG. 14 is a sectional view taken along a line of A-A' of FIG. 13 to illustrate the semiconductor package according to the sixth embodiment.

Referring to FIGS. 13 and 14, the first and second semiconductor chips 10a and 10b may be mounted on the package substrate 100. The first and second semiconductor chips 10a and 10b may be provided to have the pad arrangement described with reference to FIGS. 11 and 12. As described with reference to FIGS. 1 through 3, the package substrate 100 may include the power supply region 100a and the interconnection region 100b around the power supply region 100a. The ground terminal 120 and the power terminal 130 may be provided on the power supply region 100a of the package substrate 100. As described above, the inner interconnection lines 103, the bonding pads 105, and the external connection pads 107 may be provided on the interconnection region 100b of the package substrate 100.

According to the present embodiment, the first and second semiconductor chips 10a and 10b may share the ground terminal 120 of the package substrate 100, but the first and second semiconductor chips 10a and 10b may be applied with different power voltages. For example, the package substrate 100 may include the ground terminal 120, the first power terminal 130a provided at one side of the ground terminal 120, and the second power terminal 130b provided at other side of the ground terminal 120.

The first and second semiconductor chips 10a and 10b may be provided to have minor symmetry on the package substrate 100. Accordingly, the ground pads 11a of the first and second semiconductor chips 10a and 10b may be connected in common to the ground terminal 120 via the bumps 15. The power pads 11d of the first semiconductor chip 10a may be connected to the first power terminal 130a via the bumps 15, and the power pads 11e of the second semiconductor chip 10b may be connected to the second power terminal 130b via the bumps 15. The I/O pads 11c of the first and second semiconductor chips 10a and 10b may be connected to the bonding pads 105 of the package substrate 100.

Furthermore, as described with reference to FIG. 6, the first power connection terminals 110d may be attached on the bottom surface of the first power terminal 130a, and the second power connection terminals 110e may be attached on the bottom surface of the second power terminal 130b. First and second power voltages from the external electronic device may be applied to the first and second power connection terminals 110d and 110e, respectively. Further, the ground connection terminals 110a may be attached on the bottom surface of the ground terminal 120.

Figure 15:
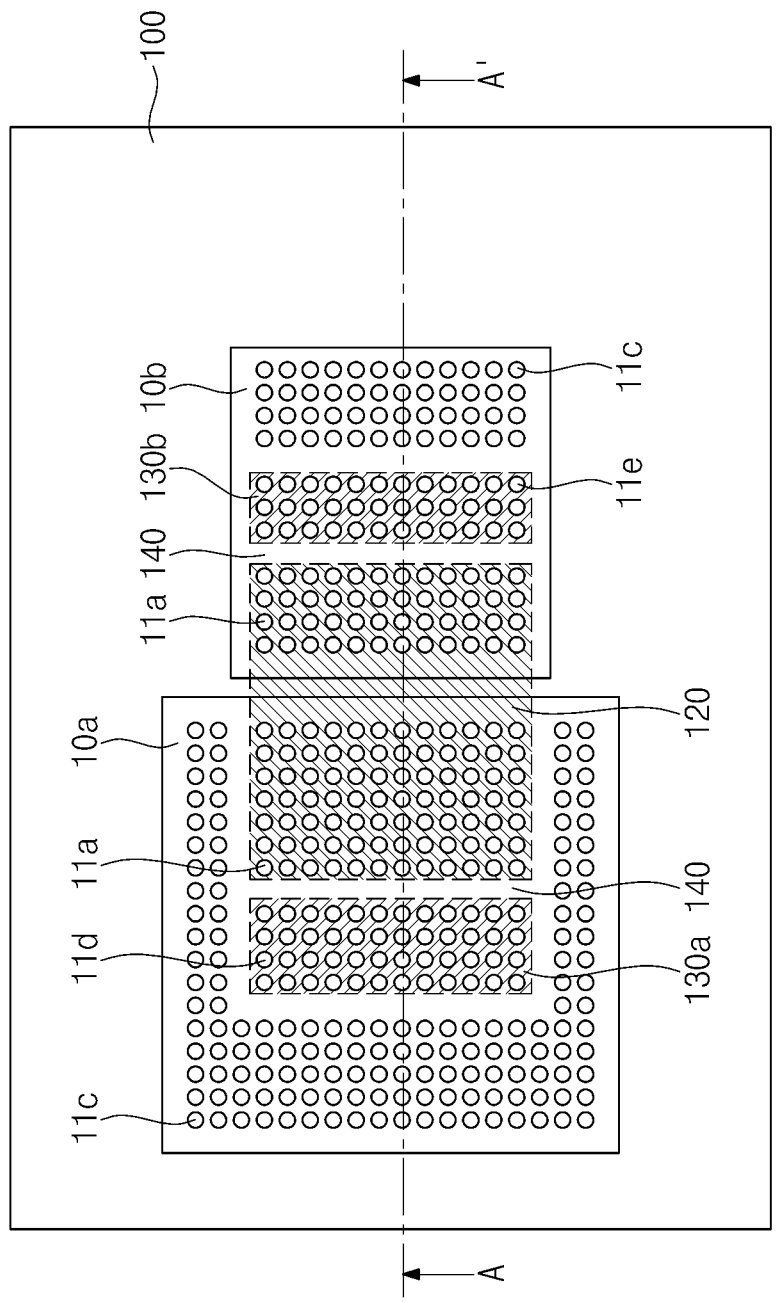
FIG. 15 is a schematic plan view of a semiconductor package according to a seventh embodiment.
Figure 16:
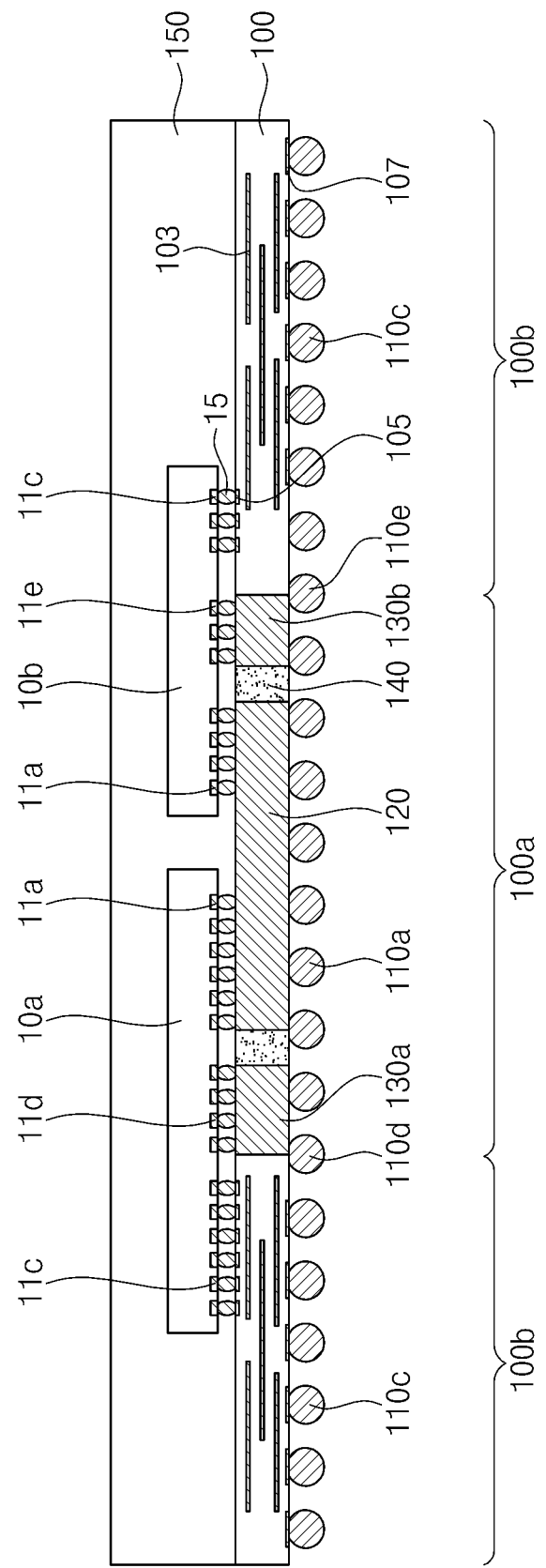
FIG. 16 is a sectional view taken along a line of A-A' of FIG. 15 to illustrate the semiconductor package according to the seventh embodiment.

FIG. 15 is a schematic plan view of a semiconductor package according to a seventh embodiment, and FIG. 16 is a sectional view taken along a line of A-A' of FIG. 15 to illustrate the semiconductor package according to the seventh embodiment.

As shown in FIGS. 15 and 16, the first and second semiconductor chips 10a and 10b having different pad arrangements from each other may be mounted on the package substrate 100, in which the ground terminals 120 and the power terminals 130 are provided, as described with reference to FIGS. 1 through 3. According to the present embodiment, the first and second semiconductor chips 10a and 10b may share the ground terminal 120, and the number of the ground pads 11a of the first semiconductor chip 10a may be greater than the number of the ground pads 11a of the second semiconductor chip 10b. Further, the I/O pads 11c of the first and second semiconductor chips 10a and 10b may be connected to the bonding pads 105 of the package substrate 100. Further, the number of the I/O pads 11c of the first semiconductor chip 10a may be greater than the number of the I/O pads 11c of the second semiconductor chip 10b.

Figure 17:
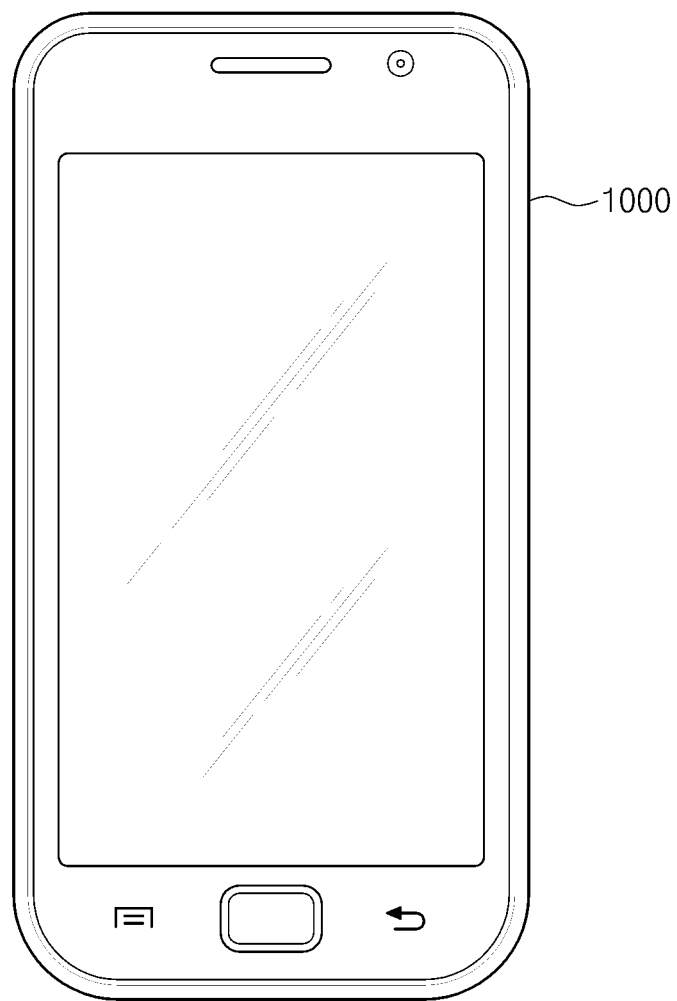
FIG. 17 is a diagram illustrating an example of electronic devices including the semiconductor package according to example embodiments.
Figure 18:
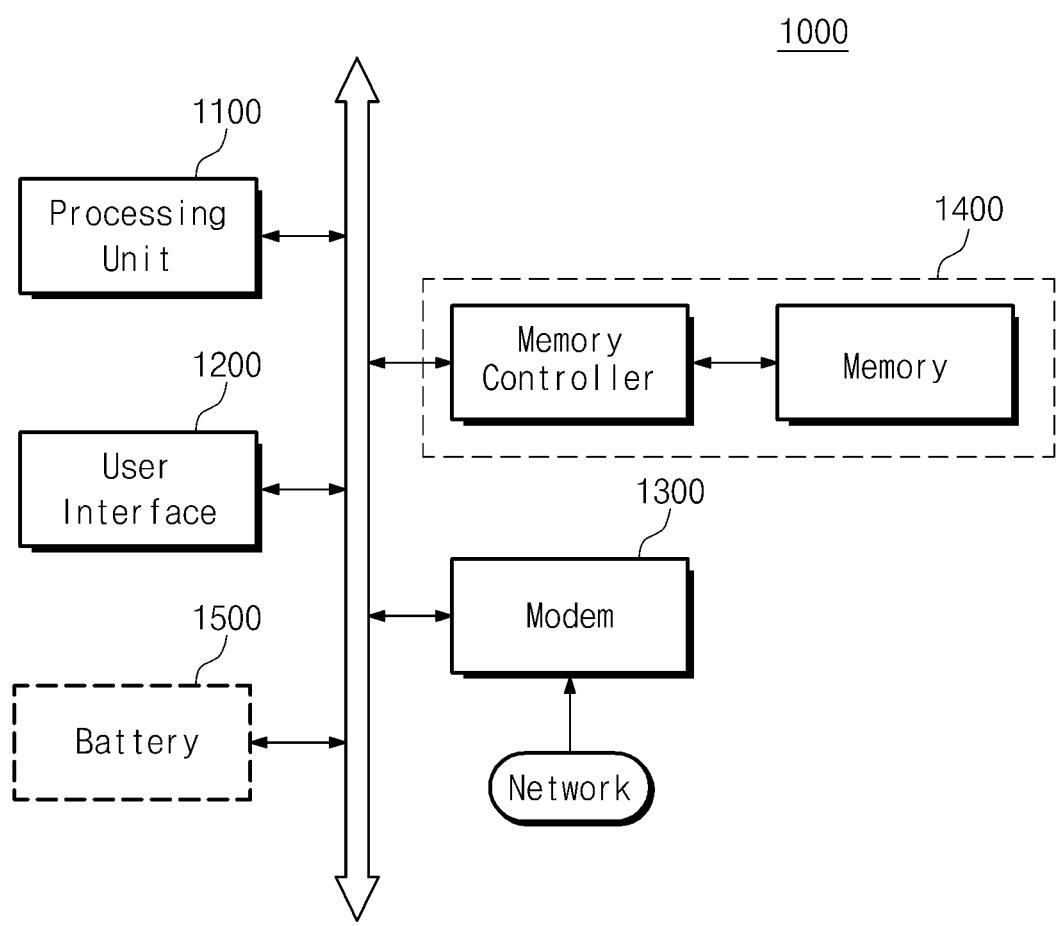
FIG. 18 is a block diagram illustrating an example of electronic devices including the semiconductor package according to example embodiments.

FIG. 17 is a diagram illustrating an example of electronic devices including the semiconductor package according to example embodiments. FIG. 18 is a block diagram illustrating an example of electronic devices including the semiconductor package according to example embodiments.

Referring to FIG. 17, the semiconductor package according to example embodiments may be used to realize a mobile phone 1000. Alternatively, the semiconductor package according to example embodiments may be used to realize a smart phone, a personal digital assistant (PDA), a portable multimedia player (PMP), a digital multimedia broadcast (DMB) device, a global positioning system (GPS), a handheld gaming console, a portable computer, a web tablet, a wireless phone, a digital music player, a memory card, or other electronic products, which may be configured to receive or transmit information data wirelessly.

Referring to FIG. 18, an electronic device 1000 according to example embodiments may include a micro-processor 1100, a user interface 1200, a modem 1300 (e.g., a baseband chipset), and a semiconductor package 1400. The electronic device 1000 may be configured to have the same features as those previously described with reference to FIGS. 1 through 12.

In the case where the electronic device 1000 is provided for the mobile application, the electronic device 1000 may further include a battery 1500. Although not shown, the electronic device 1000 may further include other electronic components, such as an application chipset and a camera image processor (CIS), as will be obvious to skilled persons in the art.

According to example embodiments, the package substrate may include a ground terminal connected to a plurality of ground pads of a semiconductor chip and a power terminal connected to a plurality of power pads of the semiconductor chip. By increasing an overlap area between the ground and power terminals of the package substrate, it is possible to increase a coupling capacitance between the ground and power terminals. Therefore, it possible to effectively transmit electric power to the semiconductor chip, and improve performance of the semiconductor package.

While example embodiments have been particularly shown and described, it will be understood by one of ordinary skill in the art that variations in form and detail may be made therein without departing from the spirit and scope of the attached claims.

What is claimed is:

1. A semiconductor package, comprising:
    a package substrate which comprises a power supply region and an interconnection region around the power supply region;
    a ground terminal and a power terminal which are disposed in the power supply region with a dielectric interposed between the ground terminal and the power terminal, wherein the ground terminal and the power terminal extend from a top surface of the package substrate to a bottom surface of the package substrate; and
    at least one semiconductor chip mounted on the package substrate comprising a plurality of ground pads which are commonly connected to the ground terminal and a plurality of power pads which are commonly connected to the power terminal.

2. The semiconductor package of claim 1, wherein the power terminal has a closed-loop structure enclosing the ground terminal in plan view.

3. The semiconductor package of claim 1, wherein the power terminal comprises a first power terminal at one side of the ground terminal with the dielectric interposed between the first power terminal and the ground terminal, and a second power terminal at another side of the ground terminal with the dielectric interposed between the second power terminal and the ground terminal.

4. The semiconductor package of claim 1, wherein the package substrate comprises a plurality of insulating layers vertically stacked in the interconnection region and inner interconnection lines disposed between the insulating layers, and
    wherein the dielectric is formed of a material having a dielectric constant higher than that of any of the insulating layers.

5. The semiconductor package of claim 4, wherein the ground terminal and the power terminal are electrically separated from the inner interconnection lines.

6. The semiconductor package of claim 1, wherein the ground terminal comprises a plurality of vertically-stacked first conductive patterns and a plurality of first via plugs which electrically connect the vertically-stacked first conductive patterns,
    wherein the power terminal comprises a plurality of vertically-stacked second conductive patterns and a plurality of second via plugs which electrically connect the vertically-stacked second conductive patterns.

7. The semiconductor package of claim 1, wherein an area of the ground terminal is larger than that of the power terminal in a plan view.

8. The semiconductor package of claim 1, wherein a number of the ground pads is greater than a number of the power pads.

9. The semiconductor package of claim 1, wherein a plurality of the semiconductor chips are mounted on the package substrate, and
  wherein the ground terminal and the power terminal are shared by the semiconductor chips.

10. The semiconductor package of claim 1, wherein the package substrate comprises a plurality of bonding pads which are disposed on a top surface of the interconnection region,
  wherein the bonding pads are connected to I/O pads which are used to input and output electrical signals to the at least one semiconductor chip, and
  wherein a width of the ground terminal is greater than a width of the bonding pads.

11. The semiconductor package of claim 1, wherein the plurality of ground pads and the plurality of power pads are simultaneously connected to the ground terminal and the power terminal, respectively.

12. The semiconductor package of claim 1, wherein the dielectric interposed between the ground terminal and the power terminal extends continuously and uninterrupted from the top surface of the package substrate to the bottom surface of the package substrate.

13. The semiconductor package of claim 1, wherein the plurality of ground pads and the plurality of power pads are disposed on a bottom surface of the at least one semiconductor chip.

14. A package substrate, comprising:
  a substrate comprising a top surface on which a semiconductor chip is mounted, wherein the substrate further comprises a power supply region and an interconnection region around the power supply region;
  a plurality of inner interconnection lines disposed in the interconnection region of the substrate to transmit external signals to the semiconductor chip;
  a ground terminal disposed in the power supply region of the substrate, and which extends from the top surface of the substrate to a bottom surface of the substrate; and
  a power terminal disposed in the power supply region of the substrate, wherein the power terminal is disposed at one side of the ground terminal with a dielectric interposed between the power terminal and the ground terminal such that the power terminal is electrically coupled with the ground terminal,
  wherein the around terminal and the power terminal are configured to commonly contact a plurality of ground pads and a plurality of power pads, respectively, of semiconductor chip mounted on the package substrate.

15. The package substrate of claim 14, wherein the substrate comprises a plurality of insulating layers that of the power terminal in a the dielectric.

16. The package substrate of claim 14, wherein the power terminal has a closed-loop structure enclosing the ground terminal in a plan view.

17. The package substrate of claim 14, wherein the power terminal comprises a first power terminal at one side of the ground terminal with the dielectric interposed between the first power terminal and the ground terminal, and a second power terminal at another side of the ground terminal with the dielectric interposed between the second power terminal and the ground terminal.

18. The package substrate of claim 14, wherein the substrate comprises a plurality of bonding pads which are disposed on the top surface of the interconnection region, and
  wherein the ground terminal and the power terminal have widths which are greater than the bonding pads.

\* \* \* \* \*